United States Patent
Pal et al.

(10) Patent No.: US 10,020,641 B1
(45) Date of Patent: Jul. 10, 2018

(54) RESISTANCE-LIMITED ELECTRICAL INTERCONNECTS

(71) Applicant: Hamilton Sundstrand Corporation, Charlotte, NC (US)

(72) Inventors: Debabrata Pal, Hoffman Estates, IL (US); Mark H. Severson, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/388,904

(22) Filed: Dec. 22, 2016

(51) Int. Cl.
*H02B 1/20* (2006.01)
*H02B 1/24* (2006.01)
*H05K 7/14* (2006.01)

(52) U.S. Cl.
CPC ............. *H02B 1/20* (2013.01); *H02B 1/24* (2013.01); *H05K 7/1404* (2013.01); *H05K 7/1461* (2013.01)

(58) Field of Classification Search
CPC ........... H01L 2224/48472; H01L 2224/48465; H05K 7/1404; H05K 7/1461; H02B 1/20; H02B 1/24
See application file for complete search history.

(56) References Cited

U.S. PATENT DOCUMENTS

| | | | | |
|---|---|---|---|---|
| 4,298,904 A * | 11/1981 | Koenig | ............. | H05K 7/20545 165/80.3 |
| 4,862,326 A | 8/1989 | Blomstedt et al. | | |
| 4,971,570 A * | 11/1990 | Tolle | .................... | H05K 7/1404 361/709 |
| 5,472,353 A * | 12/1995 | Hristake | ............. | H05K 7/1404 361/709 |
| 2003/0048618 A1 * | 3/2003 | Adams, Sr. | .......... | H05K 7/1404 361/740 |
| 2008/0019102 A1 * | 1/2008 | Yurko | .................. | H05K 7/1404 361/719 |
| 2010/0020514 A1 * | 1/2010 | Lee | ....................... | H05K 7/1404 361/801 |
| 2010/0226106 A1 * | 9/2010 | Suarez | ................ | H05K 7/1404 361/759 |

(Continued)

FOREIGN PATENT DOCUMENTS

| | | |
|---|---|---|
| DE | 3518873 A1 | 11/1986 |
| EP | 2928274 A2 | 10/2015 |

OTHER PUBLICATIONS

Search Report from corresponding European Patent Application No. 17209763.6 dated May 17, 2018.

*Primary Examiner* — Adam B Dravininkas
(74) *Attorney, Agent, or Firm* — Scott D. Wofsy; Christopher J. Cillie

(57) ABSTRACT

A resistance-limited electrical interface includes a printed wiring board, a bus bar, a U-shaped conductor, and a retainer. The bus bar extends from the printed wiring board. The U-shaped conductor has a first wall and an opposed second wall, the bus bar arranged between the first and second wall to define a conductive joint between the first wall and the bus bar. The retainer is compressively seated between the second wall and bus bar opposite the conductive joint to exert force on the bus bar for retaining the bus bar in the U-shaped conductor and limiting electrical resistance of the conductive joint.

21 Claims, 7 Drawing Sheets

(56) References Cited

U.S. PATENT DOCUMENTS

| | | | |
|---|---|---|---|
| 2011/0058335 A1* | 3/2011 | Sullivan | H05K 7/1404 361/704 |
| 2012/0051014 A1* | 3/2012 | Duffy | H05K 7/1404 361/759 |
| 2012/0170175 A1 | 7/2012 | Silberbauer et al. | |
| 2012/0293967 A1* | 11/2012 | Borghoff | H01L 23/10 361/747 |
| 2016/0049760 A1 | 2/2016 | Pradier et al. | |

* cited by examiner

RESISTANCE-LIMITED ELECTRICAL INTERCONNECTS

BACKGROUND OF THE INVENTION

1. Field of the Invention

The present disclosure relates to power distribution systems, and more particularly to electrical interconnects for power panels in power distribution systems.

2. Description of Related Art

Electrical systems, such as aircraft electrical systems, commonly include electrical cabinets. Power is generally routed from power sources like generators and batteries of powered devices through electrical cabinets, typically through a contactor or breaker interconnecting the powered device to the main bus through an intervening conductor. The contactor or breaker generally has on and off states allowing selective application of power to the powered device, electrical current flowing from the main bus to the powered device through the intervening conductor when the contactor is in the on state.

Current flow generates heat from resistive heating of current carrying components. The amount of heat generally corresponds to the electrical resistance of the conductor carrying the electrical current, such as the main bus and the intervening conductor connecting the contactor to the main bus when the contactor or breaker is in an on-state. As the connectors between the intervening conductor and main bus itself have electrical resistance, heat generation in electrical cabinets also corresponds to the resistance of energized connectors contained within the electrical cabinet. The heat is typically removed from the electrical cabinet for dissipation the external environment by passive or active cooling techniques.

Such conventional methods and systems have generally been considered satisfactory for their intended purpose. However, there is still a need in the art for improved interconnect arrangements. The present disclosure provides a solution for this need.

SUMMARY OF THE INVENTION

A resistance-limited electrical interface includes a printed wiring board, a bus bar, a U-shaped conductor, and a retainer. The bus bar extends from the printed wiring board. The U-shaped conductor has a first wall and an opposed second wall, the bus bar arranged between the first and second wall to define a conductive joint between the first wall and the bus bar. The retainer is compressively seated between the second wall and bus bar opposite the conductive joint to exert force on the bus bar for retaining the bus bar in the U-shaped conductor and limiting electrical resistance of the conductive joint.

In certain embodiments, the U-shaped conductor can include an electrically conductive material. The U-shaped conductor can have a base. The first wall and the second wall can extend from the base on opposite sides of the bus bar. The base, first wall, and second wall can define a U-shaped profile. The first wall can be spaced apart from the second wall by a gap. A fastener aperture can extend through the base from the gap. A fastener can be seated within the fastener aperture for seating the U-shaped conductor to a cabinet backplane and electrically connecting the bus bar to the backplane through the U-shaped conductor.

In accordance with certain embodiments, the retainer can include an electrically conductive material. The retainer can include a wedgelock. The retainer can have first and second heights. The second height can be greater than the second height. When set to the first height the retainer can fix the bus bar against the second wall such that the joint has a first electrical resistance. When set to the second height the retainer can fix the bus bar against the second wall such that the joint has a second electrical resistance, the second electrical resistance being lower than the first electrical resistance. In an exemplary embodiment, when the retainer is set to the second height, heat generated by resistive heating of the bus bar can be about 10% of that generated when the retainer is set to the first height.

It is also contemplated that, in accordance with certain embodiments, a bus bar insulator can be arranged between the retainer and the bus bar. The bus bar insulator can overlap the electrical interface. The bus bar insulator can extend beyond the electrical interface along the bus bar. An insulator can be arranged between the retainer and the U-shaped conductor. The insulator can overlap the electrical interface. Either or both of the insulator and the bus bar insulator can electrically insulate the retainer from the U-shaped conductor. Either or both of the insulator and bus bar insulators can thermally insulate the retainer from the U-shaped conductor.

A power panel includes a PWB with an input bus bar and an output bus bar connected to a backplane by electrical interconnects as described above. A switch with an on-state and an off-state is electrically connected to the input bus bar and the output bus bar. In the on-state the switch electrically connects the input bus bar with the output bus bar such that the switch temperature is higher than both temperature of the input bus and the output bus bar for a predetermined current flow. In certain embodiments, the switch can include a contactor. In accordance with certain embodiments, the switch can include one or more solid-state switch devices. In an exemplary embodiment the predetermined current is about 500 amps.

A method of making a resistance-limited electrical interface includes receiving a bus bar in a connector and seating a retainer between the bus bar and the connector. The method includes fixing the bus bar in the connector be setting the height of the retainer at a first height. The method also includes reducing resistance of a joint between the bus bar and connector by increasing height of the retainer to a second height.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
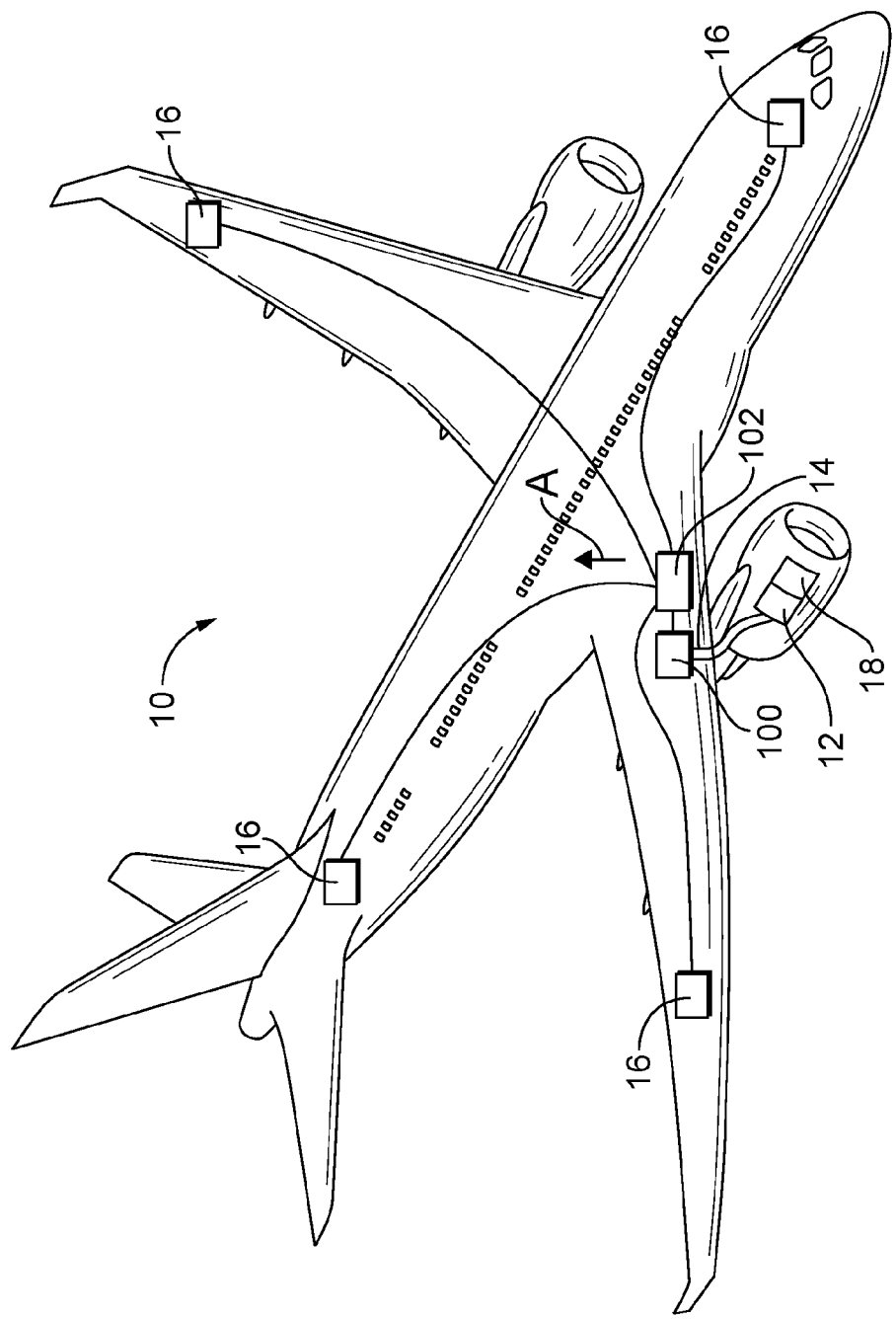
FIG. 1 is a schematic view of an exemplary embodiment of an aircraft electrical system constructed in accordance with the present disclosure, showing a power panel with a resistance-limited electrical interface.

Reference will now be made to the drawings wherein like reference numerals identify similar structural features or aspects of the subject disclosure. For purposes of explanation and illustration, and not limitation, a partial view of an exemplary embodiment of a low resistance electrical interconnect in accordance with the disclosure is shown in FIG. 1 and is designated generally by reference character 100. Other embodiments of low resistance electrical interconnects, power panels, and methods of making low resistance electrical interconnects in accordance with the disclosure, or aspects thereof, are provided in FIGS. 2-7, as will be described. The systems and methods described herein can be used in electrical systems, such as in aircraft power distribution systems, though the present disclosure is not limited to aircraft or to power distribution systems in general.

Referring now to FIG. 1, an exemplary electrical system 10 for a vehicle is shown, e.g., an aircraft. Electrical system 10 includes a generator 12, a main power bus 14, and a plurality of power consuming devices 16. A source of motive power 18, e.g., a gas turbine engine, is operatively connected to generator 12 to provide mechanical rotation thereto. Generator 12 is configured for generating electrical power using rotation received from source of motive power 18, and providing the electrical power main power bus 14.

Main power bus 14 is in selective electrical communication with one or more of the plurality of power-consuming devices 16 through a power panel 100 having a low resistance electrical interface 102. In certain embodiments, main power bus 14 can be a single phase power bus, such as direct current (DC) power bus, electrical interface 102 connecting one or more DC powered electrical devices to main power bus 14. In accordance with certain embodiments, main power bus 14 can be a polyphase power bus, such as a three phase alternating current (AC) power bus, electrical interface 102 connecting one or more AC powered electrical devices to main power bus 14. It is contemplated that electrical interface 102 provide electrical communication within a power distribution panel, e.g., power panel 100. It is also contemplated that electrical interface be housed at other locations within electrical system 10, as suitable for an intended application.

Figure 2:
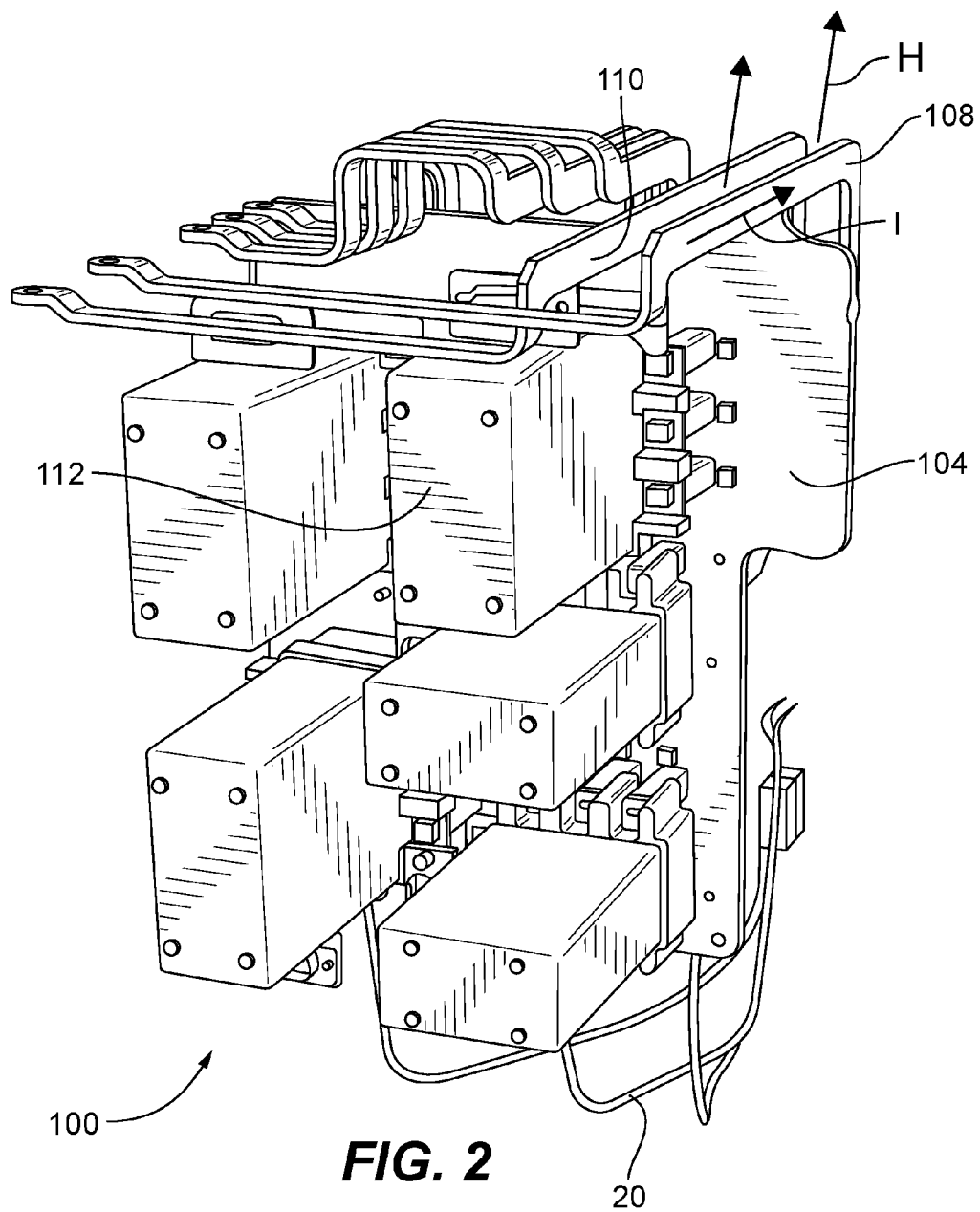
FIG. 2 is perspective view of the power panel of FIG. 1, showing a printed wiring board (PWB) supporting a switch and having input and output bus bars.

With reference to FIG. 2, power panel 100 is shown. Power panel 100 includes a printed wiring board (PWB) 104 in electrical communication with a backplane 106 (shown in FIG. 3) through electrical interface 102 (shown in FIG. 1). PWB 104 includes an input bus bar 108, an output bus bar 110, and one or more electrical switch 112. Switch 112 is supported by PWB 104, has an on state and an off state, and is electrically connected to both input bus bar 108 and output bus bar 110 through PWB 104. Input bus bar 108 is in electrical communication with main power bus 14 (shown in FIG. 1) through an input electrical interface 102. Output bus bar 110 is in electrical communication with one or more power-consuming devices 16 (shown in FIG. 1) through an output electrical interface 102.

Switch 112 controls electrical communication between input bus bar 108 and output bus bar 110. When in the off state, switch 112 electrically isolates output bus bar 110 from input bus bar 108 such that no electrical current flows from main power bus 14 (shown in FIG. 1) to power-consuming device 16 (shown in FIG. 1). When in the on state, switch 112 electrically connects output bus bar 110 with input bus bar 108 such that input bus bar 108 is in electrical communication with output bus bar 110, electrical current thereby flowing between input bus bar 108 and output bus bar 110. The state assumed by switch 112 can be controlled according to commands received from a control device (not shown for clarity reasons) connected to switch 112 via a control lead 20, for example via PWB signal connectors (shown in FIGS. 6A and 6B).

In certain embodiments, switch 112 can include a contactor device with a movable conductive member. In accordance with certain embodiments, switch 112 can include one or more solid-state switch devices. Examples of suitable solid-state switch devices include metal-oxide-semiconductor field-effect-transistor (MOSFET), insulated-gate bipolar-transistor (IGBT), or any other suitable type of solid-state switch device. Switch 112 can include a switch array having a plurality of switch devices arranged for cooperative switching. As will be appreciated by those of skill in the art in view of the present disclosure, electrical current flow I generates heat H according to electrical resistance opposing current flow I, which my require active or passive dissipation provisioning to transfer to the ambient environment. In an exemplary embodiment PWB 104 and backplane 106 are Intelligent Solid-State Switching System assemblies respectively configured and adapted to carry currents of 500 amps or higher.

Figure 3:
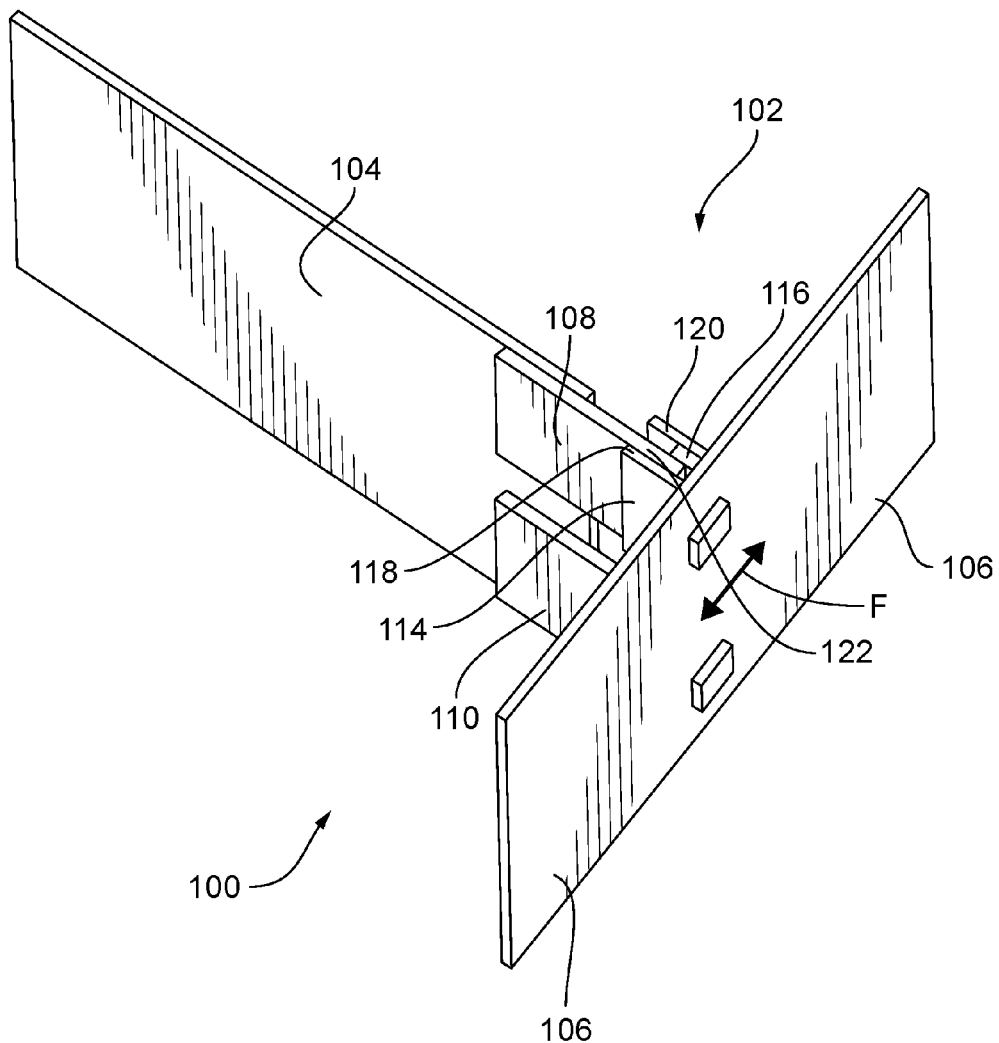
FIG. 3 is a schematic perspective view of the power panel of FIG. 1, showing a PWB in electrical communication with a backplane through the electrical interface.

With reference to FIG. 3, electrical interface 102 is shown in a perspective view. Electrical interface 102 includes PWB 104, input bus bar 108, a U-shaped conductor 114, and a retainer 116. Input bus bar 108 extends from PWB 104. U-shaped conductor 114 has a first wall 118 and a second wall 120. An electrically conductive joint 122 is defined between first wall 118 and input bus bar 108. Retainer 116 is arranged between second wall 120 and input bus bar 108 on a side 124 of input bus bar 108 opposite electrically conductive joint 122, and is compressively seated between input bus bar 108 and second wall 120 to limit electrical resistance of conductive joint 122. Although described in the exemplary embodiments herein as a U-shaped conductor, it is contemplated that conductors with other shapes can also benefit from the present disclosure, e.g., round, oblong, V-shaped, etc.

Input bus bar 108 extends longitudinally from PWB 104 along a longitudinal axis defined by PWB 104. Backplane 106 is substantially orthogonal relative to the longitudinal axis defined by PWB 104 and has one or more electrical traces that are in electrical communication with input bus bar 108 through U-shaped conductor 114. Although described herein with reference to input bus bar 108, it is to be understood and appreciated that output bus bar 110 can also be connected to a separate trace on backplane 106 through a similarly arranged electrical interface, e.g., output electrical interface 102. In the illustrated input bus bar 108 and output bus bar 110 are arranged on a common longitudinal end of PWB 104, simplifying the arrangement of power panel 100. In certain embodiments, input bus bar 108 and output bus bar are arranged on opposite longitudinal ends of PWB 104, allowing integration of PWB 104 into certain legacy power panels.

Figure 4:
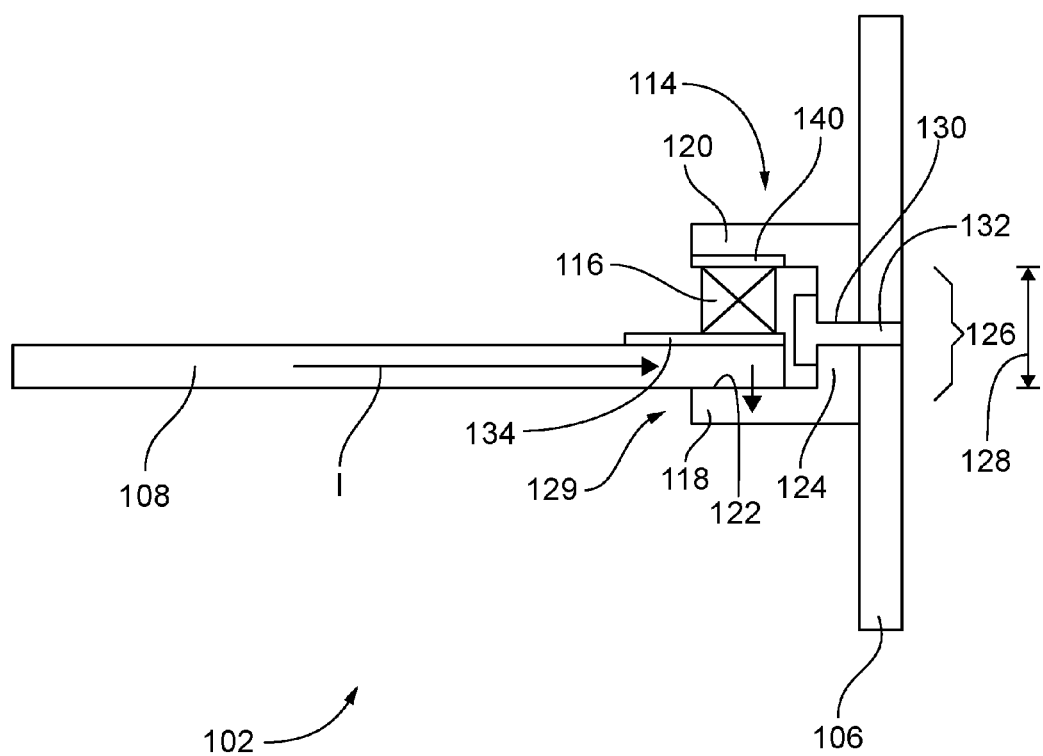
FIG. 4 is a plan view of the resistance limited electrical interface of FIG. 1, showing current flow between a bus bar and a backplane through an joint where electrical resistance of the joint reduced by retention force applied to the joint by a retainer.

With reference to FIG. 4, electrical interface 102 is shown in a plan view. U-shaped conductor 114 is constructed from an electrically conductive material, such as aluminum or copper, and includes first wall 118, second wall 120, and a base 124. First wall 118 and second wall 120 are both connected to base 124 on an end, extend longitudinally therefrom on laterally opposite sides of input bus bar 108, and define between one another a gap 126. Gap 126 has a gap width 128. In the illustrated exemplary embodiment U-shaped conductor 114 has a U-shaped profile 129, similar to that defined by extruded channel stock material. U-shaped profile provide rigidity, enabling force F exerted by retainer 116 to be communicated to conductive joint 122 for reducing electrical resistance of conductive joint 122.

Base 124 has a fastener aperture 130. Fastener aperture 130 extends through base 124 from gap 126 to a side of base 124 opposite gap 126. A fastener 132 is seated in fastener aperture 130 for seating U-shaped conductor 114 to backplane 106. It is contemplated that fastener 132 can electrically connect base 124 to a trace disposed within backplane 106. It is also contemplated that fastener 132 can be arranged such that base 124 abuts a trace arranged on a surface of backplane 106, as suitable for an intended application.

Electrical interface 102 includes one or more insulators. In this respect electrical interface 102 includes a bus bar insulator 134. Bus bar insulator 134 is arranged between retainer 116 and input bus bar 108 and is arranged on a side of input bus bar 108 opposite conductive joint 122. Bus bar insulator 134 overlays (relative to the top of the drawing figure) conductive joint 122 and extends to a location arranged longitudinally beyond conductive joint 122 along the length of input bus bar 108. It is contemplated that the longitudinal end of bus bar insulator 134 be spaced apart from retainer 116 according to the voltage potential difference between input bus bar 108 and retainer 116, thereby preventing arcing between input bus bar 108 and retainer 116 that could occur in certain types of high voltage applications.

Bus bar insulator 134 includes an electrically insulating material 136. Electrically insulating material 136 electrically insulates retainer 116 from input bus bar 108, preventing current flow from input bus bar 108 which could otherwise cause resistive heating of the material forming retainer, potentially excluding certain retainer arrangements from use in electrical interconnects above certain amp ratings. Advantageously, the use bus bar insulator 134 also thermally insulates retainer 116 from input bus bar 108, limiting thermal communication between input bus bar 108 and retainer 116 and allowing use of retainer arrangements including materials that could soften when exposed to heat dissipated from input bus bar 108 above a certain amp rating. Examples of suitable electrically insulating materials include silicones sold under the tradename SIL-PAD®, available from the Bergquist Company of Chanhassen Minn., and plastics and elastomers sold under the tradename Chomerics®, available from the Chomerics Corporation of Woburn Mass.

In the illustrated exemplary embodiment electrical interface 102 also includes an insulator 140. Insulator 140 is similar to bus bar insulator 134 with the difference that insulator 140 is arranged between second wall 120 and retainer 116. Insulator 140 overlays (relative to the drawing sheet) both retainer 116 and conductive joint 122. It is contemplated that conductor insulator 140 also include an electrically insulating material, e.g., electrically insulating material 136. The electrically insulating material of insulator 140 cooperates with the electrically insulating material of bus bar insulator 134 to electrically isolate retainer 116 from U-shaped conductor 114, preventing retainer 116 from acquiring a voltage potential. Preventing retainer 116 from acquiring a voltage potential reduces the likelihood of arc events, which could otherwise weld together movable elements within retainer 116.

In certain embodiments, the electrically insulating material forming insulator 140 can also be thermally insulating. This can limit thermal communication between second wall 120 and retainer 116, thereby allowing use of retainer arrangements including materials that could soften when exposed to heat dissipated from second wall 120 above a certain amp rating. Although described herein as having both bus bar insulator 134 and insulator 140, it is to be appreciated that electrical interface 102 can include neither bus bar insulator 134 nor insulator 140, only bus bar insulator 134, or only insulator 140, as suitable for a given application.

Retainer 116 is seated in gap 126 between second wall 120 and input bus bar 108. In the illustrated exemplary embodiment retainer 116 is seated between bus bar insulator 134 and insulator 140 in compression. The compressive seating of retainer 116 causes retainer 116 to exert retention force F (shown in FIG. 3) on conductive joint 122. Exertion of retention force F on conductive joint 122 provides fixation of input bus bar 108 in intimate mechanical and electrical contact with first wall 118 compressively, thereby eliminating the need connecting input bus bar 108 with U-shaped conductor 114 using fasteners, brazing, soldering, or other rigid joint that could otherwise inhibit movement of input bus bar 108 relative to second wall 120 due to heating. Retention force F also reduces the electrical resistance presented by conductive joint 122 to current I traversing conductive joint 122.

Figure 5A:
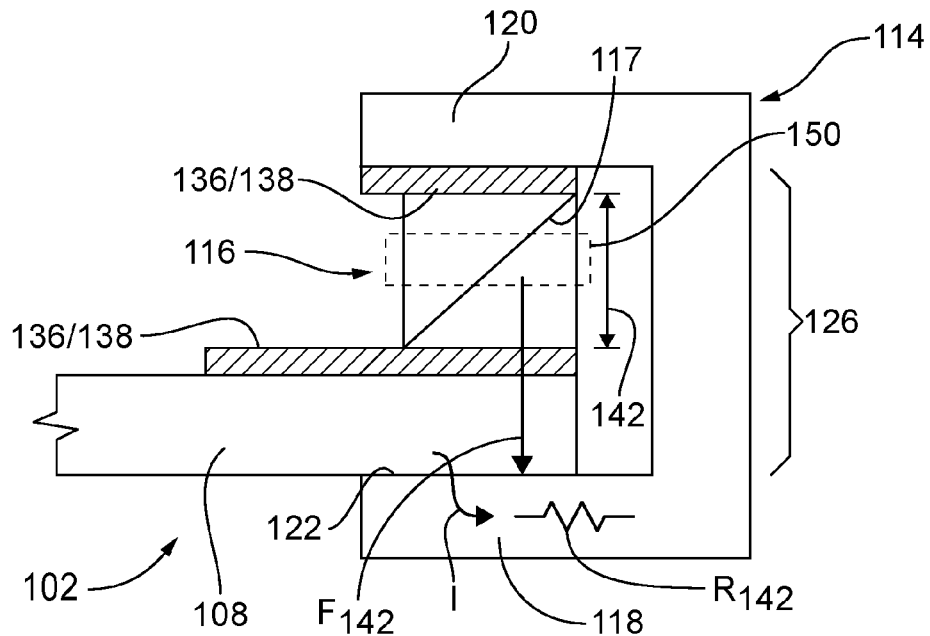
FIGS. 5A and 5B are schematic views of the electrical interface of FIG. 1, showing a retainer with first and second retainer heights.
Figure 5B:
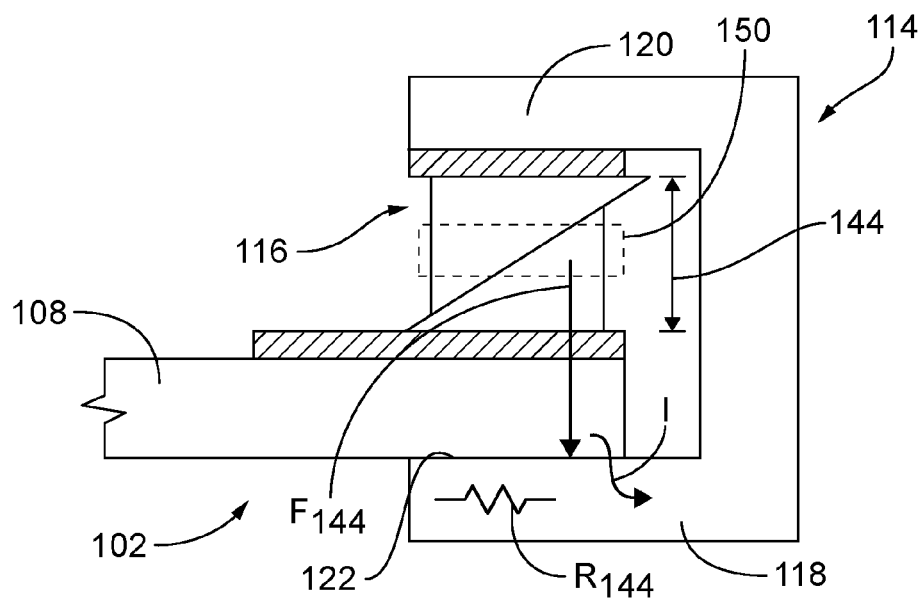

With reference to FIGS. 5A and 5B, retainer 116 is shown schematically. Retainer 116 has a height and is seated within gap 126 such that height spans gap 126 and extends between first wall 118 and second wall 120. It is contemplated that height be variable. In this respect height can be adjusted between a first height 142 (shown in FIG. 5A) and a second height 144 (shown in FIG. 5B), for example by way of an adjustment body 150. Adjustment body 150 may include, for example, a clamp, a fastener, or a power screw device. In certain embodiments retainer 116 includes a variable height retainer, e.g., a wedgelock 117. Examples of such wedgelock devices include Card-Lok® Series 260 retainers, available from Pentair Technical Products, Inc. of Golden Valley, Minn.

First height 142 is sufficient to retain input bus bar 108 within U-shaped conductor 114. Second height 144 is greater than first height 142. In certain embodiments, U-shaped conductor 114 is substantially rigid, increasing height of retainer 116 from first height 142 to second height 144 increases magnitude of the retention force F exerted on conductive joint 122 by retainer 116. Therefore, while setting retainer 116 at first height 142 causes retainer 116 to exert a first retention force $F_{142}$ on conductive joint 122 suitable for retaining input bus bar 108 within U-shaped conductor 114, and setting retainer 116 at second height 144 causes retainer 116 to exert a second retention force $F_{144}$ on conductive joint 122 which is greater than first retention force $F_{142}$. Since electrical resistance of conductive joint 122 corresponds to the magnitude of the retention force exerted on conductive joint 122, increasing height of retainer 116 from first height 142 to second height 144, this increases the normal force, i.e. retention force F (shown in FIG. 3), reducing the electrical resistance of conductive joint 122 from first electrical resistance $R_{142}$ to second resistance $R_{144}$, thereby rendering electrical interface 102 a low-resistance interconnect.

Figure 6A:
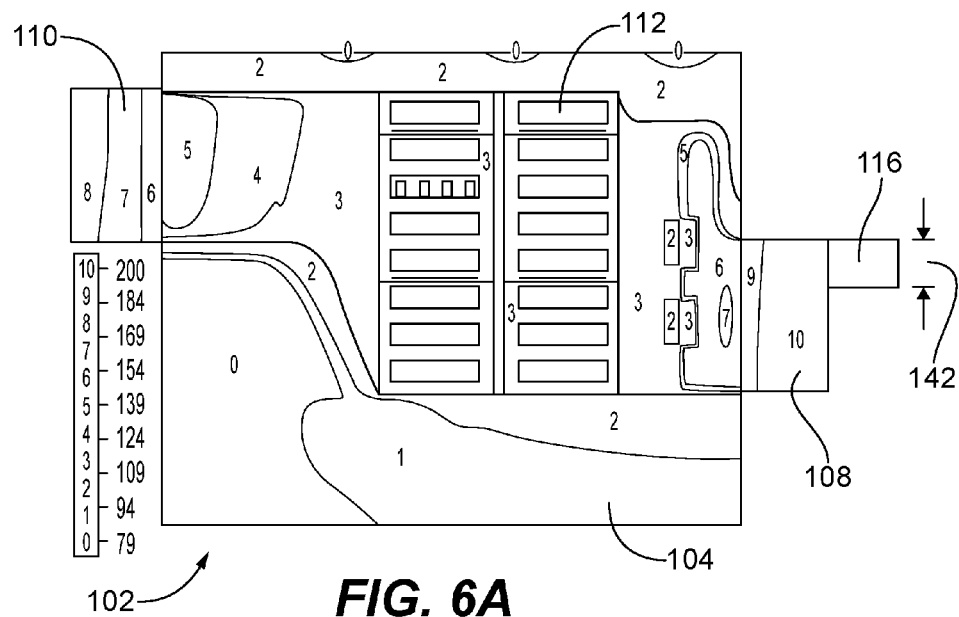
FIGS. 6A and 6B are thermographs of the electrical interface of FIG. 1, showing bus bar temperatures when the interface retainer is set to the first and second heights, respectively.
Figure 6B:
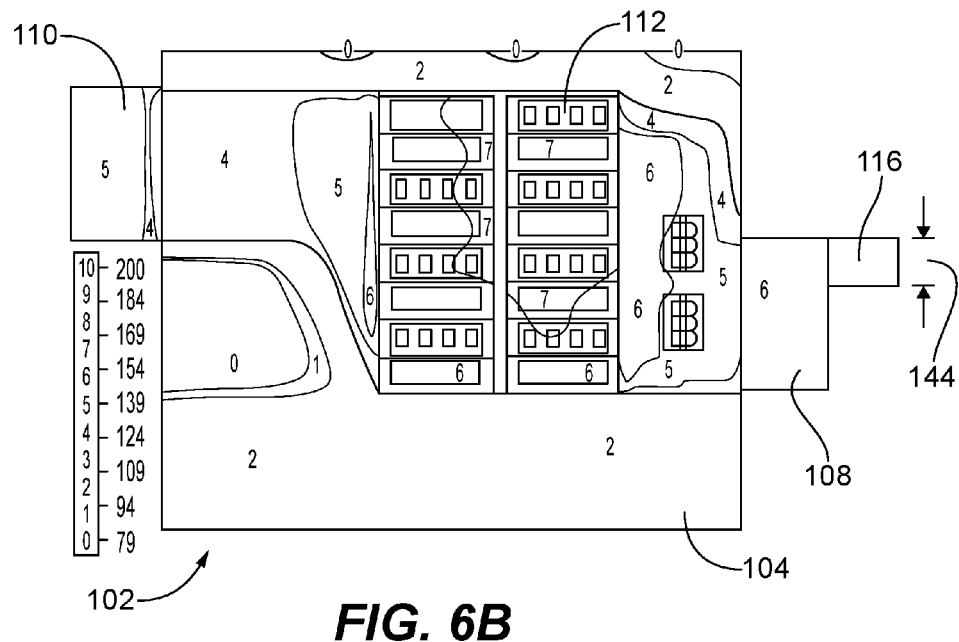

With reference to FIGS. 6A and 6B, thermographs of electrical interface 102 are shown. Referring the FIG. 6A, electrical interface 102 is shown with retainer 116 set at first height 142. At first height 142, retainer 116 exerts retention force F (shown in FIG. 3) sufficient to retain input bus bar 108 against first wall 118. However, electrical resistance of conductive joint 122 is such current flow therethrough causes input bus bar 108 to run at a higher temperature than switch 112. In contrast, when retainer 116 is set at second height 144, electrical resistance is reduced, and resistive heating associated with current flow through input bus bar 108 is such that switch 112 runs at a higher temperature than input bus bar 108. Testing by the Applicant demonstrates that heat generation by the same current flow with retainer 116 set at second height 144 results in a reduction of about 90% in resistive heating of input bus bar 108 due to the electrical resistance presented by conductive joint 122 to current traversing conductive joint 122 compared to when retainer 116 is set to first height 142, which is unexpectedly better performance than would otherwise be expected by the amount of retention force exerted by retainer 116 on U-shaped conductor 114.

Figure 7:
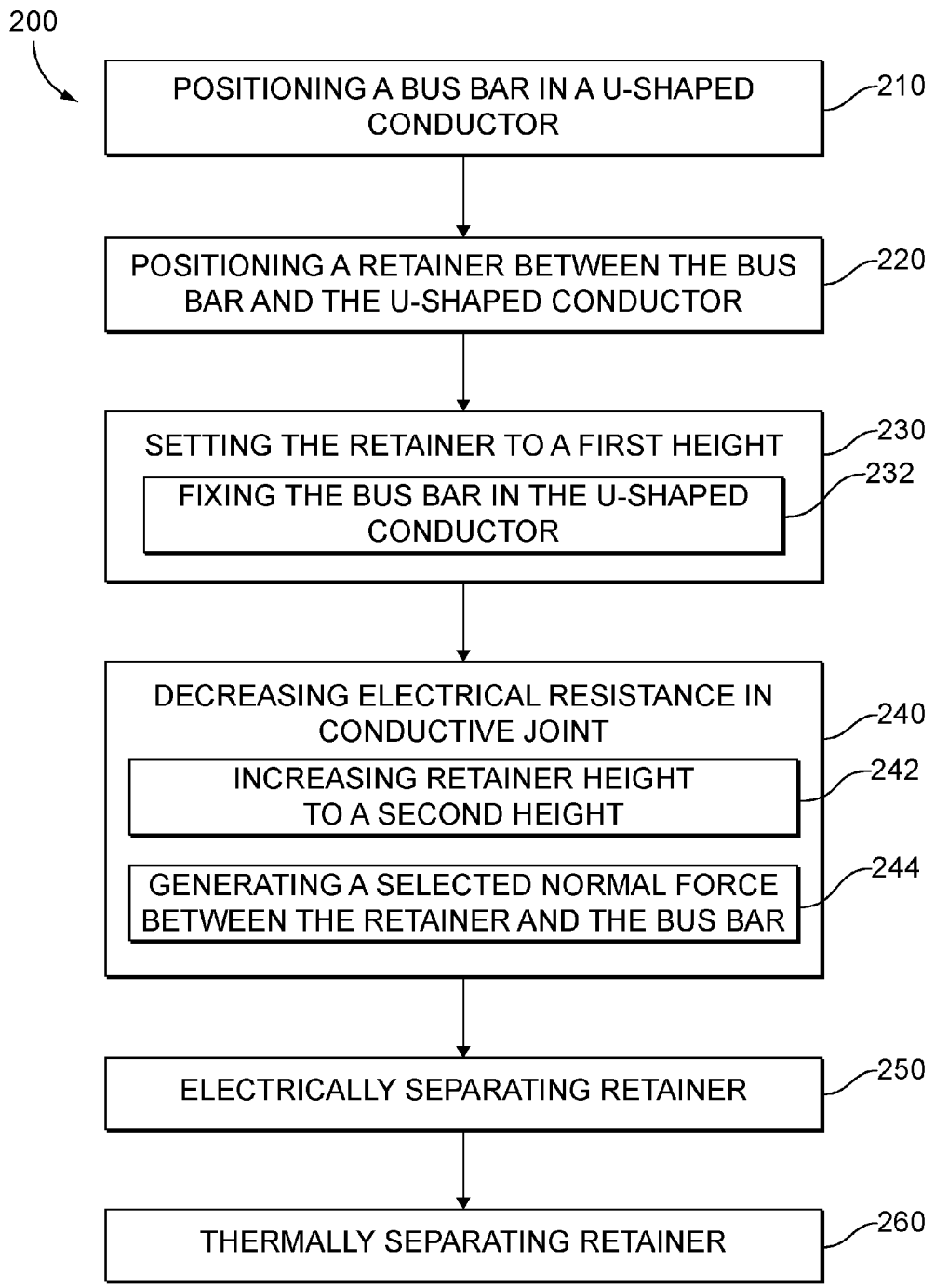
FIG. 7 is a flow chart of a method of making a resistance-limited electrical interface, showing steps of the method.

With reference to FIG. 7, a method 200 of making a low resistance electrical interface, e.g., electrical interface 102 (shown in FIG. 1), is shown. Method 200 includes positioning a bus bar, e.g., input bus bar 108 (shown in FIG. 3), in a U-shaped conductor, e.g., U-shaped conductor 114 (shown in FIG. 3), as shown with box 210. The bus bar can be positioned between first and second opposed walls of the U-shaped conductor. A retainer, e.g., retainer 116, is seated between the bus bar and the U-shaped conductor as shown with box 220. The retainer can be positioned between the bus bar and the first opposing wall of the U-shaped conductor. The retainer is set to a first height, e.g., first height 142 (shown in FIG. 6A), to exert a retention force sufficient to fix the bus bar in a conductive joint, e.g., conductive joint 122, defined between the bus bar and the U-shaped conductor, as shown with boxes 230 and 232. Electrical resistance of the electrical joint is thereafter decreased by increasing height of the retainer from the first height to a second height, e.g., second height 144, as shown with box 240. It is contemplated that this generates a selected normal force between the retainer and the bus bar sufficient, rendering the electrical interconnect a low resistance electrical interconnect.

Method 200 can include electrically separating the retainer from the bus bar, as shown with box 250. Electrically separating the retainer from the bus bar can include arranging a bus bar insulator, e.g., bus bar insulator 134, between the bus bar and the U-shaped conductor. Method 200 can also include thermally separating the retainer from the bus bar, such as with the bus bar insulator and/or one more of the thermal interfaces bounded by the bus bar insulator.

Method 200 can include electrically separating the retainer from the U-shaped conductor, as shown with box 260. For example, method 200 can include arranging an insulator, e.g., insulator 140, between the retainer and the U-shaped conductor. Method 200 can also include thermally separating the retainer from the U-shaped conductor, such as with the insulator and/or one more of the thermal interfaces bounded by the insulator.

Connectors between bus bars and backplanes in some power panels can have significant electrical resistance. For example, in some power panels 75 watts or more of waste heat can be generated with current flows of around 500 amps of DC power. The heat generated by the connection can increase the operating temperature of the PWB connected to the bus bar by upwards of 50 degrees Celsius due to heat conducted from the U-shaped conductor to the PWB. The heat can thermally soak switches supported by the PWB, such as solid-state MOSFET-type switch devices, potentially reducing the reliability and/or lifetime of the devices. The heat can also render the arrangement non-compliant with certain platform requirements, where the heat generation requirement can be on the order of about 7.5 watts.

In embodiments described herein connectors having a U-shaped profile seat the PWB bus bars. A retainer compressively seats within the connector and exerts a retention force on the conductive joint defined between the bus bar and the connector. Height of the retainer is selected such that the retainer both structurally and electrically connects the bus bar within the connector, for example by dialing the height of the retainer beyond that necessary to structurally retain the bus bar to a height where the electrical resistance reduces heat generation in the connector to within a predetermined requirement, for example, from about 75 watts to about 7.5 watts in contemplated embodiments. The electrical interconnect thereby reduces heat dissipation from the connector, can improve heat transfer from the electrical interconnect, and/or reduce component operating temperature. Reliability of electrical components likes switches and the like can also be improved.

The methods and systems of the present disclosure, as described above and shown in the drawings provide for electrical interfaces with superior properties including reduced electrical resistivity and/or reduced heat generation from electrical current flow traversing the electrical interface. While the apparatus and methods of the subject disclosure have been shown and described with reference to preferred embodiments, those skilled in the art will readily appreciate that change and/or modifications may be made thereto without departing from the scope of the subject disclosure.

What is claimed is:
1. A low resistance electrical interface, comprising:
  a printed wiring board (PWB);
  a bus bar extending from the PWB;
  a U-shaped conductor with first and second opposing walls receiving the bus bar, wherein a conductive joint is defined between the bus bar and the first wall of the U-shaped conductor; and
  a retainer arranged between the second wall and the bus bar, wherein the retainer is compressively seated on a side of the bus bar opposite the conductive joint to retain the bus bar in the U-shaped conductor and limit electrical resistance of the conductive joint,
  wherein the bus bar is an input bus bar, and further comprising an output bus bar connected to the PWB and connectable to the input bus bar.

2. The interface as recited in claim 1, wherein the input bus bar and the output bus bar are arranged on longitudinally opposite ends of the PWB.

3. The interface as recited in claim 1, wherein the input bus bar and the output bus bar arranged on a common longitudinal end of the PWB.

4. The interface as recited in claim 1, wherein the retainer comprises a wedgelock with a first height and a second height, the second height being greater than the first height.

5. A low resistance electrical interface, comprising:
a printed wiring board (PWB);
a bus bar extending from the PWB;
a U-shaped conductor with first and second opposing walls receiving the bus bar, wherein a conductive joint is defined between the bus bar and the first wall of the U-shaped conductor:
a retainer arranged between the second wall and the bus bar, wherein the retainer is compressively seated on a side of the bus bar opposite the conductive joint to retain the bus bar in the U-shaped conductor and limit electrical resistance of the conductive joint,
wherein the first and second opposed walls of the U-shaped conductor extend from a base, wherein the retainer is seated in a gap defined between the first wall and the opposed second wall; and
a bus bar insulator arranged between the retainer and the bus bar, wherein the bus bar insulator electrically separates the retainer from the bus bar, wherein the bus bar insulator extends along the bus bar to a location beyond the conductive joint.

6. The interface as recited in claim 5, wherein the retainer comprises a wedgelock with a first height and a second height, the second height being greater than the first height.

7. A low resistance electrical interface, comprising:
a printed wiring board (PWB);
a bus bar extending from the PWB;
a U-shaped conductor with first and second opposing walls receiving the bus bar, wherein a conductive joint is defined between the bus bar and the first wall of the U-shaped conductor; and
a retainer arranged between the second wall and the bus bar, wherein the retainer is compressively seated on a side of the bus bar opposite the conductive joint to retain the bus bar in the U-shaped conductor and limit electrical resistance of the conductive joint,
wherein the retainer is electrically insulated from the first wall, and wherein the retainer is electrically insulated from the bus bar.

8. The interface as recited in claim 7, wherein the retainer comprises a wedgelock with a first height and a second height, the second height being greater than the first height.

9. The interface as recited in claim 7, further comprising a switch supported by the PWB and electrically connected to the bus bar.

10. The interface as recited in claim 9, wherein the switch includes a contractor device or a solid-state switch device.

11. The interface as recited in claim 9, wherein the switch has an on state, wherein temperature of the bus bar is lower than temperature of the switch when the switch is in the on state.

12. The interface as recited in claim 7, wherein the first and second opposed walls of the U-shaped conductor extend from a base, wherein the retainer is seated in a gap defined between the first wall and the opposed second wall.

13. The interface as recited in claim 12, further comprising an insulator arranged between the retainer and the U-shaped conductor, wherein the U-shaped conductor insulator electrically separates the retainer from the second wall, wherein the insulator overlaps the conductive joint.

14. The interface as recited in claim 7, further comprising a fastener extending through the U-shaped conductor for fixing the U-shaped conductor to a backplane, wherein the fastener is spaced apart from the retainer and the bus bar.

15. The interface as recited in claim 7, wherein the retainer is thermally insulated from the first wall, wherein the retainer is thermally insulated from the bus bar.

16. A power panel, comprising:
a backplane;
an electrical interface as recited in claim 7, wherein the U-shaped conductor is fixed to the backplane; and
a switch with an on state supported by the PWB and connected to the bus bar,
wherein the retainer has a first height and a second height,
wherein the retainer exerts force sufficient to retain the bus bar in the conductive joint when set to the first height and the second height,
wherein temperature of the bus bar is higher than temperature of the switch when the switch is in the on state and the retainer is set to the first height, and
wherein temperature of the bus bar is lower than temperature of the switch when the switch is in the on state and the retainer is set to the second height.

17. A method of making a low resistance electrical interface, comprising:
positioning a bus bar between a first opposing wall and a second opposing wall of a U-shaped conductor;
positioning a retainer between the bus bar and the first opposing wall;
expanding a dimension of the retainer in a direction toward the bus bar and the first opposing wall;
generating a selected normal force between the retainer and the bus bar; and
electrically separating the retainer from the bus bar.

18. The method as recited in claim 17, further comprising electrically separating the retainer from the U-shaped conductor.

19. The method as recited in claim 17, further comprising thermally separating the retainer from the U-shaped conductor.

20. The method as recited in claim 17, further comprising thermally separating the retainer from the bus bar.

21. The method as recited in claim 17 wherein expanding a dimension of a retainer includes changing height of a wedgelock from a first height to a second height, the second height being greater than the first height.

* * * * *